United States Patent
Rice et al.

(10) Patent No.: US 7,927,062 B2
(45) Date of Patent: Apr. 19, 2011

(54) METHODS AND APPARATUS FOR TRANSFERRING SUBSTRATES DURING ELECTRONIC DEVICE MANUFACTURING

(75) Inventors: Michael Rice, Pleasanton, CA (US); Nicholas Cravalho, Cambridge, MA (US); Jeffrey A. Brodine, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1019 days.

(21) Appl. No.: 11/554,530

(22) Filed: Oct. 30, 2006

(65) Prior Publication Data

US 2007/0116549 A1     May 24, 2007

Related U.S. Application Data

(60) Provisional application No. 60/738,543, filed on Nov. 21, 2005.

(51) Int. Cl.
    *G06F 15/00* (2006.01)
(52) U.S. Cl. ............................................. 414/806
(58) Field of Classification Search ................ 414/217, 414/805, 806
See application file for complete search history.

(56) References Cited

U.S. PATENT DOCUMENTS

| | | | |
|---|---|---|---|
| 4,481,592 A | 11/1984 | Jacobs et al. | |
| 4,552,502 A | 11/1985 | Harjar | |
| 4,693,370 A | 9/1987 | Aceti | |
| 4,702,665 A | 10/1987 | Nakashima et al. | |
| 4,813,844 A | 3/1989 | Torii et al. | |
| 4,813,846 A | 3/1989 | Helms | |
| 4,892,457 A | 1/1990 | Bartlett et al. | |
| 5,151,008 A | 9/1992 | Ishida et al. | |
| 5,564,889 A * | 10/1996 | Araki | 414/806 |
| 5,570,609 A | 11/1996 | Nihei et al. | |
| 5,639,204 A | 6/1997 | Nihei et al. | |
| 5,655,060 A * | 8/1997 | Lucas | 700/250 |
| 5,765,444 A | 6/1998 | Bacchi et al. | |
| 5,838,121 A | 11/1998 | Fairbairn et al. | |

(Continued)

FOREIGN PATENT DOCUMENTS

EP     1 109 201 A2     6/2001

(Continued)

OTHER PUBLICATIONS

International Search Report and Written Opinion of International Application No. PCT/US06/42952 mailed Sep. 25, 2007.

(Continued)

*Primary Examiner* — Charles A Fox
(74) *Attorney, Agent, or Firm* — Dugan & Dugan

(57) ABSTRACT

In one aspect, a first apparatus is provided that is adapted to transfer a substrate between a transfer chamber and a processing chamber. The first apparatus includes a robot having a first blade, a second blade spaced from the first blade, and a central hub coupled to the first blade by at least a first arm and coupled to the second blade by at least a second arm. The first blade and the second blade are spaced so as to allow (a) both blades to simultaneously extend through a slit valve that separates a transfer chamber from a processing chamber coupled to the transfer chamber when the robot is positioned within the transfer chamber; and (b) the first and second blades to transfer substrates to and remove substrates from the processing chamber without raising or lowering the first and second blades or the robot. Numerous other aspects are provided.

10 Claims, 6 Drawing Sheets

U.S. PATENT DOCUMENTS

| | | | |
|---|---|---|---|
| 6,022,185 A | 2/2000 | Mokuo | |
| 6,045,315 A | 4/2000 | Azumano et al. | |
| 6,071,060 A | 6/2000 | Campbell et al. | |
| 6,098,484 A | 8/2000 | Bacchi et al. | |
| 6,205,368 B1 | 3/2001 | Hirahara et al. | |
| 6,216,058 B1 * | 4/2001 | Hosek et al. | 700/245 |
| 6,481,956 B1 | 11/2002 | Hofmeister | |
| 6,547,510 B1 | 4/2003 | Beaulieu | |
| 6,571,657 B1 | 6/2003 | Olgado et al. | |
| 6,722,834 B1 * | 4/2004 | Tepman | 414/217 |
| 6,918,731 B2 * | 7/2005 | Talmer | 414/217 |
| 7,374,386 B2 * | 5/2008 | Talmer | 414/217 |
| 7,658,586 B2 * | 2/2010 | Niewmierzycki et al. | 414/217 |
| 2001/0043856 A1 | 11/2001 | Woodruff et al. | |
| 2002/0038528 A1 | 4/2002 | Blahnik | |
| 2002/0098072 A1 | 7/2002 | Sundar | |
| 2002/0192057 A1 | 12/2002 | Meulen | |
| 2003/0103836 A1 | 6/2003 | Beaulieu et al. | |
| 2004/0013497 A1 * | 1/2004 | Shirai | 414/217 |
| 2004/0141831 A1 | 7/2004 | Gilchrist et al. | |
| 2005/0110292 A1 * | 5/2005 | Baumann et al. | 294/64.1 |
| 2005/0111938 A1 | 5/2005 | van der Meulen | |
| 2005/0111956 A1 | 5/2005 | van der Meulen | |
| 2005/0113964 A1 | 5/2005 | van der Meulen | |
| 2005/0113976 A1 | 5/2005 | van der Meulen | |
| 2005/0118009 A1 | 6/2005 | van der Meulen | |
| 2005/0120578 A1 | 6/2005 | van der Meulen | |
| 2005/0223837 A1 | 10/2005 | van der Meulen | |
| 2006/0245905 A1 | 11/2006 | Hudgens | |
| 2006/0263177 A1 | 11/2006 | Meulen | |
| 2008/0063504 A1 | 3/2008 | Kroetz et al. | |
| 2008/0298945 A1 | 12/2008 | Cox et al. | |

FOREIGN PATENT DOCUMENTS

| | | |
|---|---|---|
| TW | I223107 | 11/2004 |
| TW | I229212 | 3/2005 |
| WO | WO 2005/048313 A2 | 5/2005 |
| WO | WO 2006/121931 | 11/2006 |
| WO | WO 2007/061603 A2 | 5/2007 |

OTHER PUBLICATIONS

International Preliminary Report on Patentability and Written Opinion of International Application No. PCT/US2006/042952 issued May 27, 2008.

Office Action of Chinese Patent Application No. 200610150472.0 dated Apr. 10, 2009.

Taiwan Search Report of Taiwan Patent Application No. 95140089 dated Feb. 13, 2011.

* cited by examiner

METHODS AND APPARATUS FOR TRANSFERRING SUBSTRATES DURING ELECTRONIC DEVICE MANUFACTURING

This application claims priority from U.S. Provisional Patent Application Ser. No. 60/738,543, filed Nov. 21, 2005, which is hereby incorporated by reference herein in its entirety.

FIELD OF THE INVENTION

The present invention generally relates to electronic device manufacturing, and more particularly to methods and apparatus for transferring substrates during electronic device manufacturing.

BACKGROUND OF THE INVENTION

Numerous robot designs have been developed for transferring substrates such as semiconductor wafers, glass plates or the like between processing chambers during electronic device manufacturing. For example, a conventional frog-leg robot may be employed within a transfer chamber of a processing tool to transfer substrates between load lock chambers and processing chambers of the processing tool. Substrates typically are supported on blades of the robot during transfer operations; and pockets may be formed within the blades to retain substrate position during movement of the blades, such as during rotation, extension, retraction, etc.

Use of a pocket may increase substrate stability during movement of a blade, allowing for increased blade movement rates and increased system throughput. However, pocket use also may generate particles and/or otherwise damage a substrate due to rubbing contact between the substrate and the inner walls of the pocket. Accordingly, a need exists for improved methods and apparatus for transferring substrates during electronic device manufacturing, particularly when pocketless blades are employed during substrate transfer operations.

SUMMARY OF THE INVENTION

In a first aspect of the invention, a first method is provided for transferring substrates during electronic device manufacturing. The first method includes the step of (a) providing an electronic device manufacturing system having a transfer chamber, a processing chamber coupled to the transfer chamber, and a robot positioned within the transfer chamber and adapted to transfer substrates into and from the processing chamber. The robot includes at least a first blade and a second blade each adapted to support a substrate, and extend into the processing chamber so as to place a substrate within or remove a substrate from the processing chamber. The first method also includes the steps of (b) while the first blade is empty, extending the first blade into the processing chamber at a first speed to retrieve a first substrate from a substrate support of the processing chamber; (c) transferring the first substrate to the first blade from the substrate support of the processing chamber; (d) while the first blade supports the first substrate, retracting the first blade from the processing chamber at a second speed that is slower than the first speed; (e) while the second blade supports a second substrate, extending the second blade into the processing chamber at the second speed; (f) transferring the second substrate to the substrate support of the processing chamber; and (g) retracting the second blade from the processing chamber at the first speed.

In a second aspect of the invention, a second method is provided for transferring a substrate between a transfer chamber and a processing chamber. The second method includes the steps of (a) providing a robot positioned within the transfer chamber and having a first blade and a second blade spaced from the first blade; and (b) employing the first and second blades to transfer substrates to and remove substrates from the processing chamber without raising or lowering the first and second blades or the robot.

In a third aspect of the invention, a first apparatus is provided that is adapted to transfer a substrate between a transfer chamber and a processing chamber. The first apparatus includes a robot having a first blade, a second blade spaced from the first blade, and a central hub coupled to the first blade by at least a first arm and coupled to the second blade by at least a second arm. The first blade and the second blade are spaced so as to allow (a) both blades to simultaneously extend through a slit valve that separates a transfer chamber from a processing chamber coupled to the transfer chamber when the robot is positioned within the transfer chamber; and (b) the first and second blades to transfer substrates to and remove substrates from the processing chamber without raising or lowering the first and second blades or the robot.

In a fourth aspect of the invention, a second apparatus is provided that is adapted to transfer a substrate between a transfer chamber and a processing chamber. The second apparatus includes a robot having a first blade and a second blade spaced from the first blade. The first blade and the second blade are spaced so as to allow the first and second blades to transfer substrates to and remove substrates from the processing chamber without raising or lowering the first and second blades or the robot when the robot is positioned within the transfer chamber.

In a fifth aspect of the invention, a system is provided that includes (a) a transfer chamber; (b) a processing chamber coupled to the transfer chamber via a slit valve; and (c) a robot positioned within the transfer chamber. The robot includes a first blade, a second blade spaced from the first blade, and a central hub coupled to the first blade by at least a first arm and coupled the second blade by at least a second arm. The first blade and the second blade are spaced so as to allow (i) both blades to simultaneously extend through the slit valve of the processing chamber; and (ii) the first and second blades to transfer substrates to and remove substrates from the processing chamber without raising or lowering the first and second blades or the robot. Numerous other aspects are provided.

Other features and aspects of the present invention will become more fully apparent from the following detailed description, the appended claims and the accompanying drawings.

DETAILED DESCRIPTION

The present invention provides improved robot designs and methods of operating the same. For example, in a first embodiment of the invention, a robot is provided that includes two blades that may simultaneously extend through an opening that connects a transfer chamber to a processing chamber. In some embodiments, the blades may transfer substrates to and remove substrates from the processing chamber without requiring the robot and/or the blades to be raised or lowered. In at least one embodiment, the blades may be pocketless so as to reduce particle generation during substrate transfer.

In a second embodiment, a method of operating a robot having pocketless or similar blades is provided that improves the throughput of a processing system that employs the robot. Rather than always employing the same speed for extending and retracting each blade of the robot, a first extension or retraction speed is employed when a blade is supporting a substrate, and a second, faster extension or retraction speed is employed when a blade is not supporting a substrate. Additionally, when the robot is required to rotate, any blade carrying a substrate is retracted to a position such that a center (of mass) of the substrate is approximately aligned with a center of rotation of the robot. In this manner, centrifugal forces that may cause a substrate to slide relative to a blade are reduced, and faster rotation rates may be employed. Likewise, an empty blade need only be retracted a distance required to clear any chamber walls or other obstructions during rotation. These and other embodiments are described further below with reference to FIGS. 1-6.

Figure 1:
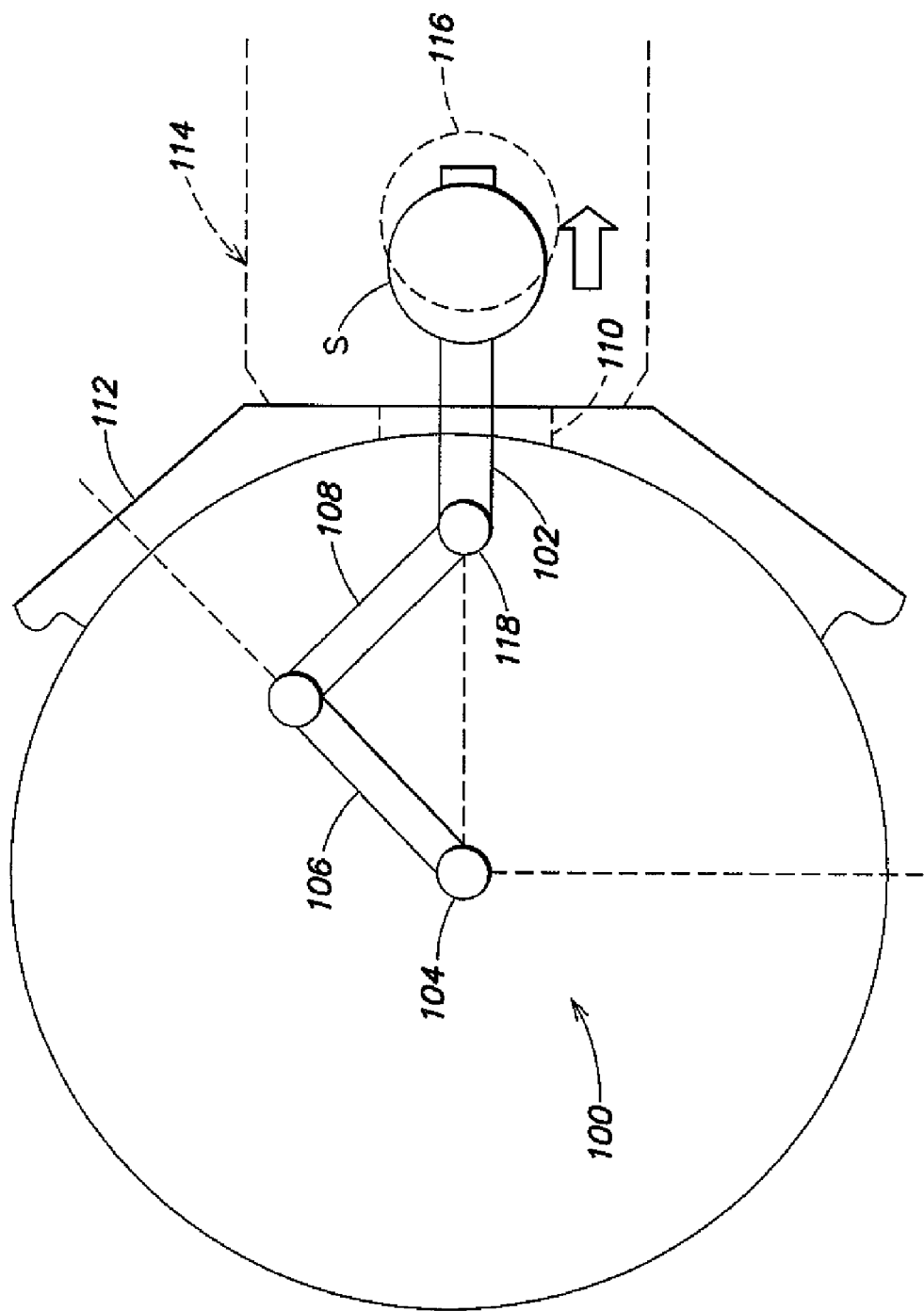
FIG. 1 is a top view of a first robot provided in accordance with the present invention.

FIG. 1 is a top view of a first robot 100 provided in accordance with the present invention. With reference to FIG. 1, the first robot 100 employs a single blade 102 that is coupled to a central hub 104 via a first arm 106 and a second arm 108. The blade 102 may employ a pocket (not separately shown) to securely hold a substrate S during transport of the substrate S, or the blade 102 may be pocketless (as shown). In at least one embodiment, the blade 102 is long enough to extend through an opening 110 (e.g., a slit valve opening) of a transfer chamber 112 that houses the robot 100 and into a processing chamber 114 (shown in phantom) such that the substrate S may be placed on or removed from a substrate support 116 (shown in phantom) of the processing chamber 114 without requiring a wrist 118 or similar portion of the robot 100 to extend into the processing chamber 114. Such a design may reduce contamination within the processing chamber 114 by preventing a potential contamination source (e.g., the wrist 118) from entering the processing chamber 114, and may allow multiple blades to be simultaneously inserted into a processing chamber as described below with reference to FIG. 5.

Figure 2:
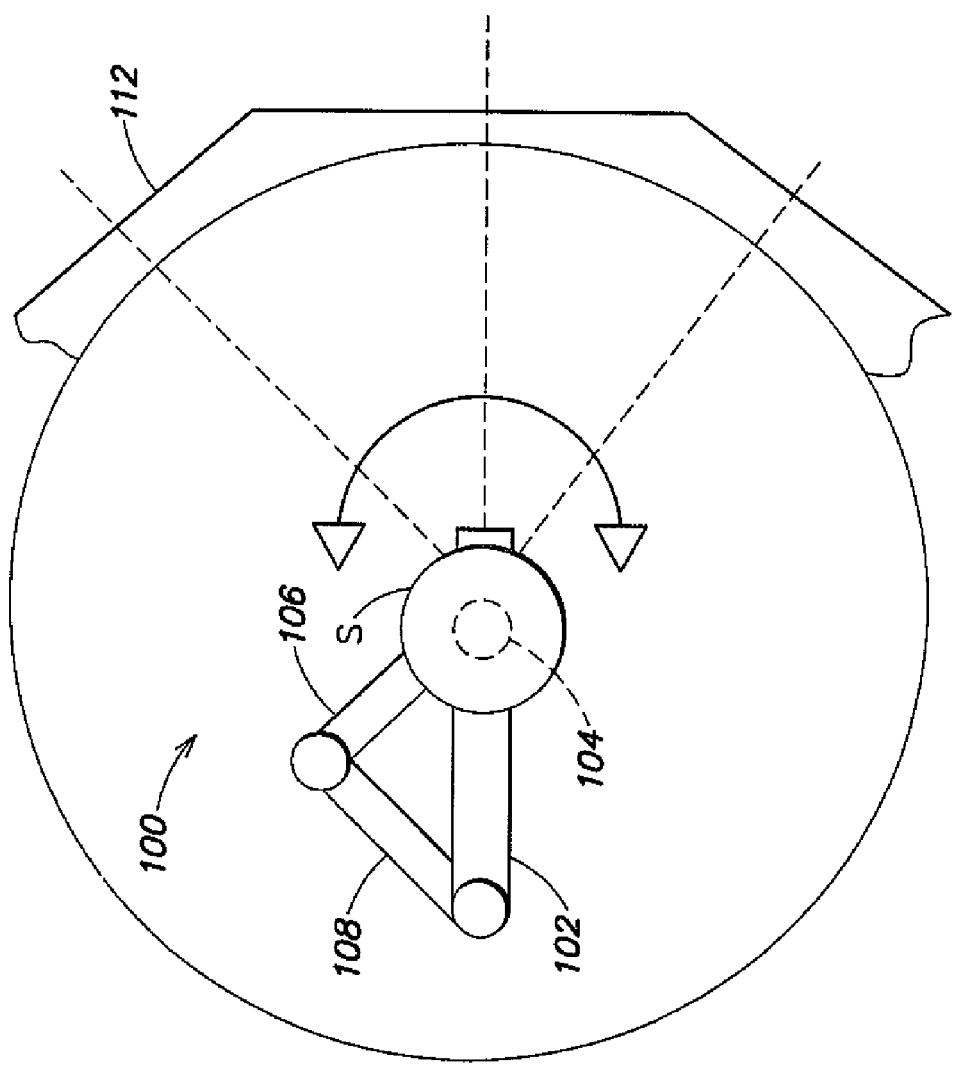
FIG. 2 is a top view of the first robot of FIG. 1 in which the blade of the robot is retracted over the central hub of the robot.

FIG. 2 is a top view of the first robot 100 in which the blade 102 is retracted over the central hub 104 (shown in phantom). Such a position may be employed when the first robot 100 is rotated, for example, to transfer the substrate S between processing chambers or between a processing chamber and a load lock chamber (not shown) coupled to the transfer chamber 112. In the embodiment shown, the first robot 100 is adapted to retract the blade 102 such that the substrate S is approximately centered over the central hub 104 of the first robot 100 and/or a center of rotation of the first robot 100. In this manner, centrifugal force on the substrate S during rotation is reduced so that the first robot 100 may be rotated at a high rate of speed (even if the blade 102 is pocketless). To allow the first robot 100 to retract over the central hub 104 as shown in FIG. 2, a selectively compliant articulated robot arm (SCARA) or similar robot configuration may be employed.

Figure 3:
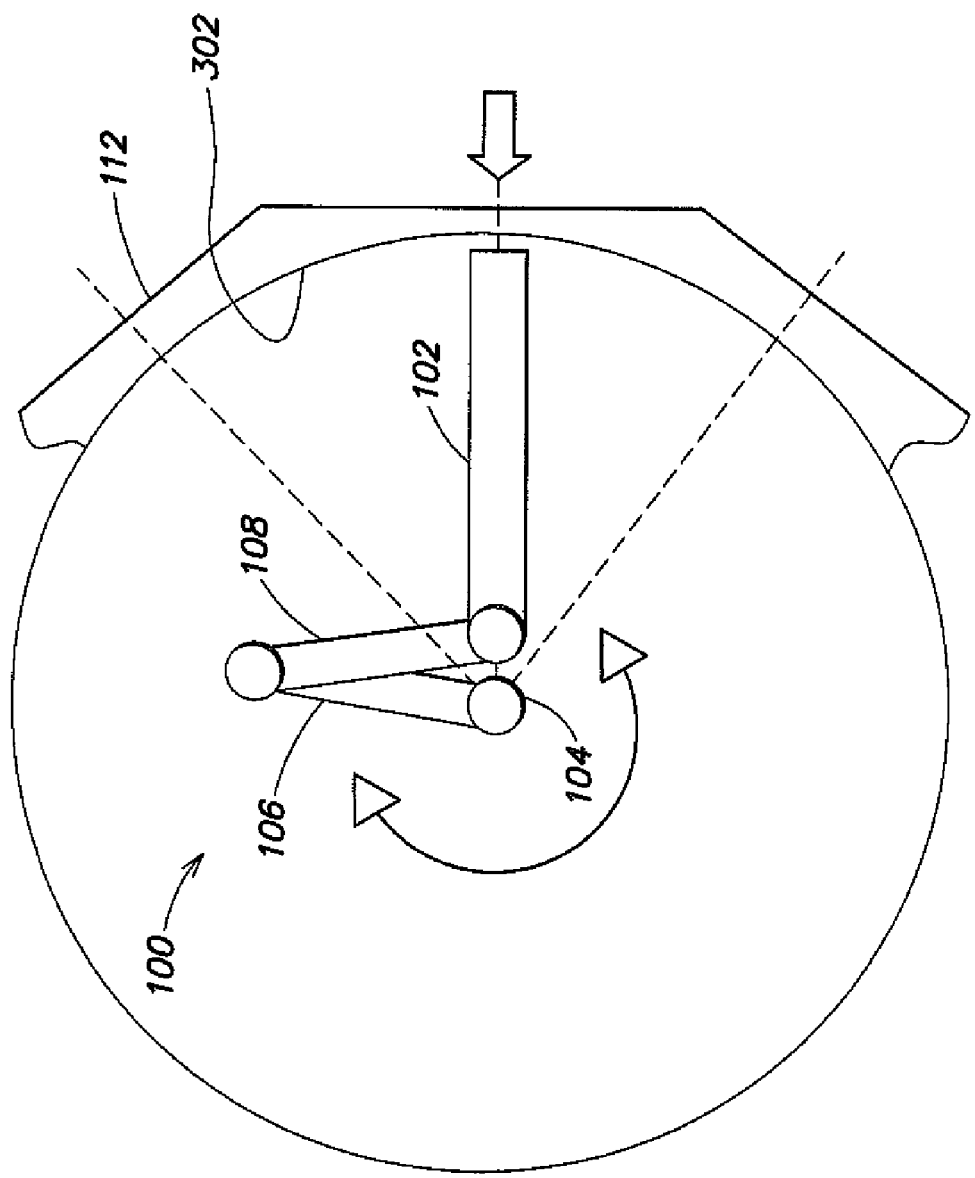
FIG. 3 is a top view of the first robot of FIG. 1 in an exemplary retracted state when the blade does not contain a substrate.

FIG. 3 is a top view of the first robot 100 in an exemplary retracted state when the blade 102 does not contain a substrate. As shown in FIG. 3, the blade 102 is partially retracted. For example, the blade 102 is only retracted a distance that allows the blade 102 to clear an inner surface 302 of the transfer chamber 112 when the first robot 100 is rotated.

Figure 4:
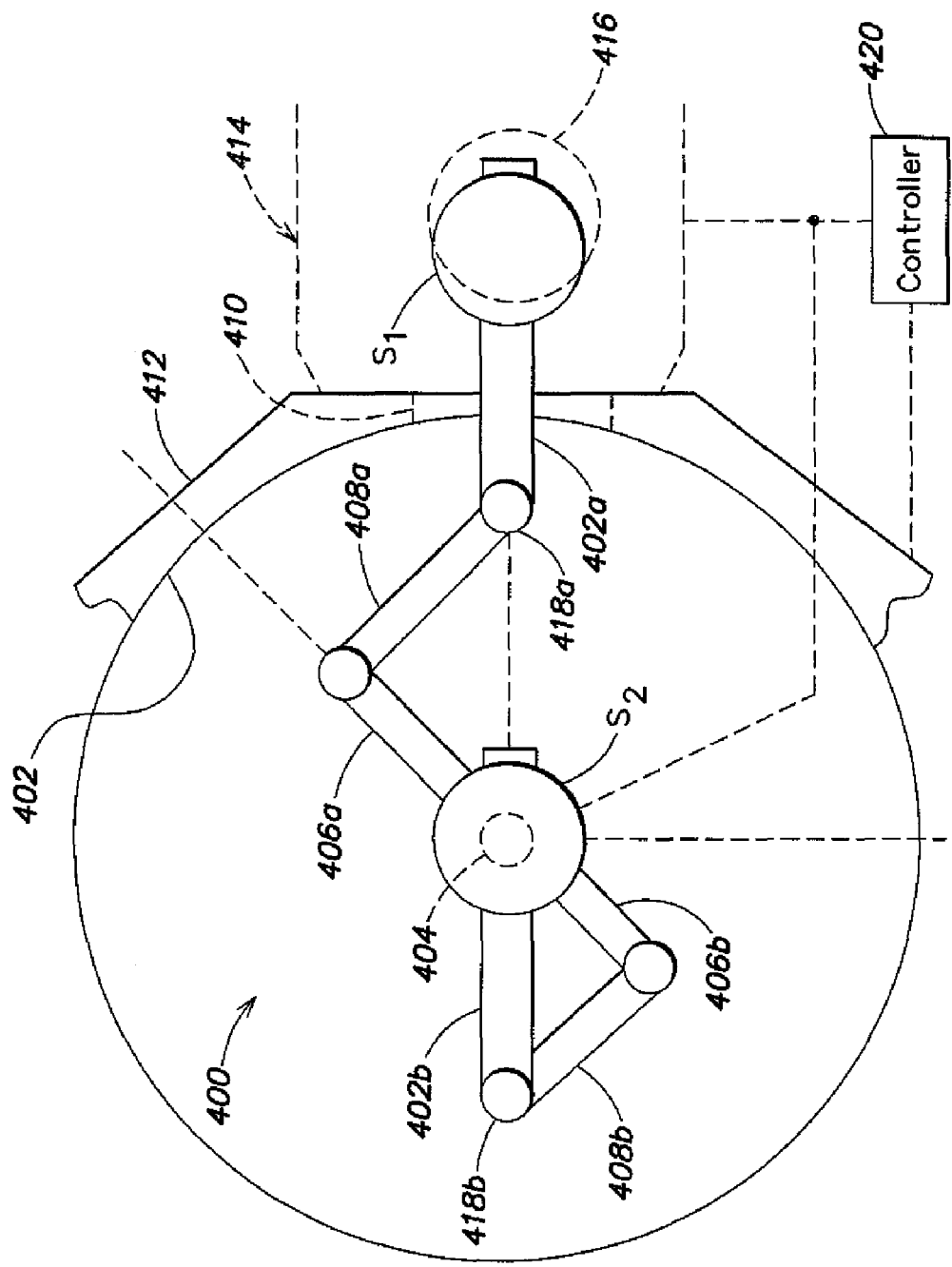
FIG. 4 is a top view of a second robot that employs two blades in accordance with the present invention.

FIG. 4 is a top view of a second robot 400 that employs two blades 402a-b in accordance with the present invention. With reference to FIG. 4, the second robot 400 includes a first blade 402a that is coupled to a central hub 404 (shown in phantom) via a first arm 406a and a second arm 408a. A second blade 402b is coupled to the central hub 404 via a first arm 406b and a second arm 408b. The blades 402a-b may each employ a pocket (not separately shown) to securely hold a substrate S1, S2, respectively, during transport of the substrates, or one or both of the blades 402a-b may be pocketless (as shown). In at least one embodiment, the blades 402a-b are long enough to extend through an opening 410 (e.g., a slit valve opening) of a transfer chamber 412 that houses the robot 400 and into a processing chamber 414 (shown in phantom) such that the substrate S1, S2 may be placed on or removed from a substrate support 416 (shown in phantom) of the processing chamber 414 without requiring a wrist 418a, 418b or similar portion of the robot 400 to extend into the processing chamber 414. Such a design may reduce contamination within the processing chamber 414 by preventing a potential contamination source (e.g., the wrists 418a-b) from entering the processing chamber 414, and may allow multiple blades to be simultaneously inserted into the processing chamber 414 as described below with reference to FIG. 5.

As with the first robot 100 of FIGS. 1-3, the second robot 400 may be adapted to retract the blades 402a-b such that the substrates S1, S2 are approximately centered over the central hub 404 of the second robot 400 and/or a center of rotation of the second robot 400 (as shown by second blade 402b in FIG. 4). In this manner, centrifugal force on the substrate S1 or S2 during rotation is reduced so that the second robot 400 may be rotated at a high rate of speed (even if the blades 402a-b are pocketless).

To allow the second robot 400 to retract the blades 402a-b over the central hub 404 as shown in FIG. 4, a SCARA or similar robot configuration may be employed. In one embodiment, the second robot 400 may be configured to rotate the first and second blades 402a-b independently (e.g., using separate drive mechanisms), or as a unit (e.g., using a single drive mechanism). Likewise, the first and second blades 402a-b may be configured to extend and retract independently (e.g., via separate drive mechanisms), or in a dependent relationship (e.g., using a single drive mechanism).

As with the first robot 100 of FIGS. 1-3, when either of the first or second blades 402a, 402b is empty, the second robot 400 may be configured to retract the empty blade 402a, 402b only a distance that allows the blade 402a, 402b to clear an inner surface 402 of the transfer chamber 412 when the second robot 400 is rotated.

Note that a controller 420 may be coupled to the robot 400, the transfer chamber 412 and/or the processing chamber 414 and control operation of the same as described below. The controller 420 may comprise one or more computers, microcontrollers, dedicated hardware, a combination of the same or the like.

Figure 5:
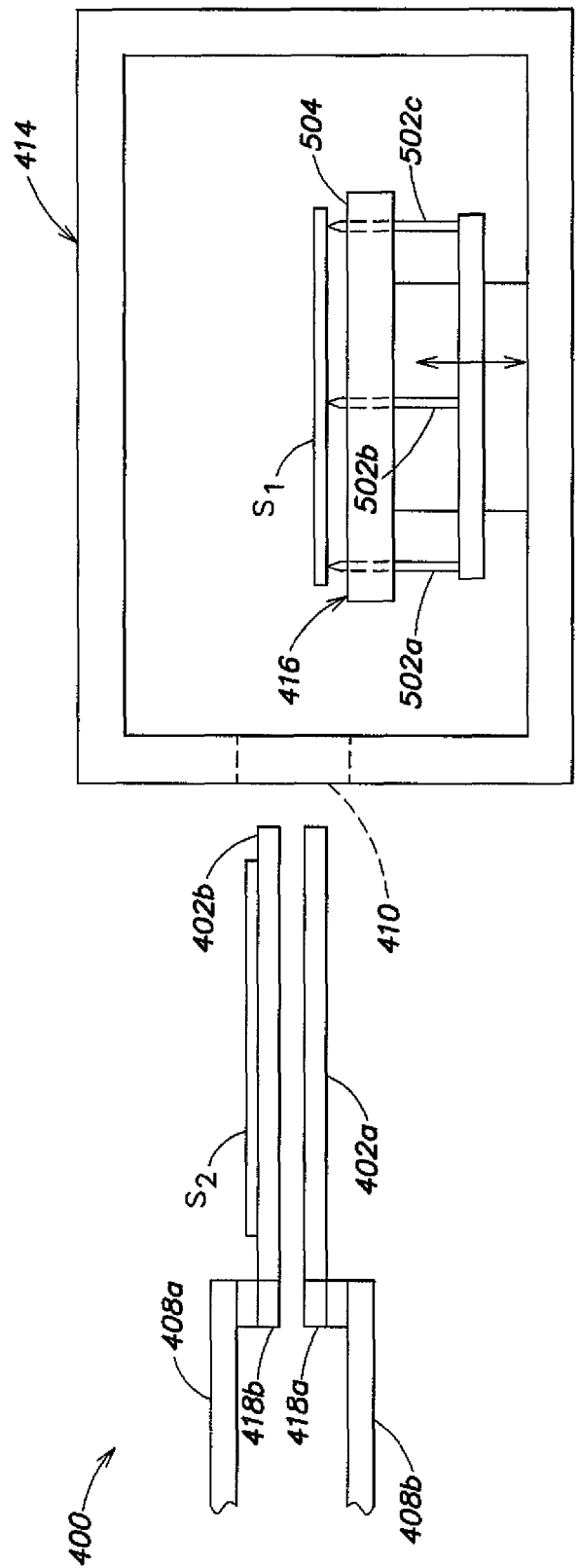
FIG. 5 is a side view of the second robot of FIG. 4 showing both blades positioned for entry into a processing chamber.

FIG. 5 is a side view of the second robot 400 of FIG. 4 showing both blades 402a-b positioned for entry into the processing chamber 414. As shown in FIG. 5, the blades 402a-b are spaced so that they may simultaneously extend through the opening 410 in the processing chamber 414. Further, the blades 402a-b are long enough to extend into the processing chamber 414 and deposit substrates onto the substrate support 416 without requiring wrists 418a-b to enter the processing chamber 414. Accordingly, even though the wrists 418a-b may be unable to simultaneously fit through the opening 410, the blades 402a-b may simultaneously perform transfer operations within the processing chamber 414.

As further shown in FIG. 5, the substrate support 416 includes a plurality of lift pins 502a-c adapted to raise and lower a substrate relative to a top surface 504 of the substrate support 416. While three lift pins are shown in FIG. 5, it will be understood that any number of lift pins may be employed.

In at least one embodiment, the lift pins 502a-c are of sufficient length to allow a substrate to be raised from the substrate support 416 to a height that allows the second blade 402b to travel underneath the substrate. The lift pins 502a-c then may be lowered to place the substrate on the second blade 402b. The lift pins 502a-c similarly may be raised above a plane of the second blade 402b to lift a substrate from the second blade 402b. Thereafter, the second blade 402b may be retracted from the processing chamber 414 and the lift pins 502a-c lowered to transfer the substrate to the substrate support 416. A similar process may be employed to transfer substrates between the first blade 402a and the substrate support 416. In this manner, substrates may be transferred between the blades 402a-b and the substrate support 416 without requiring the robot 400 or the blades 402a-b to be raised or lowered.

Figure 6:
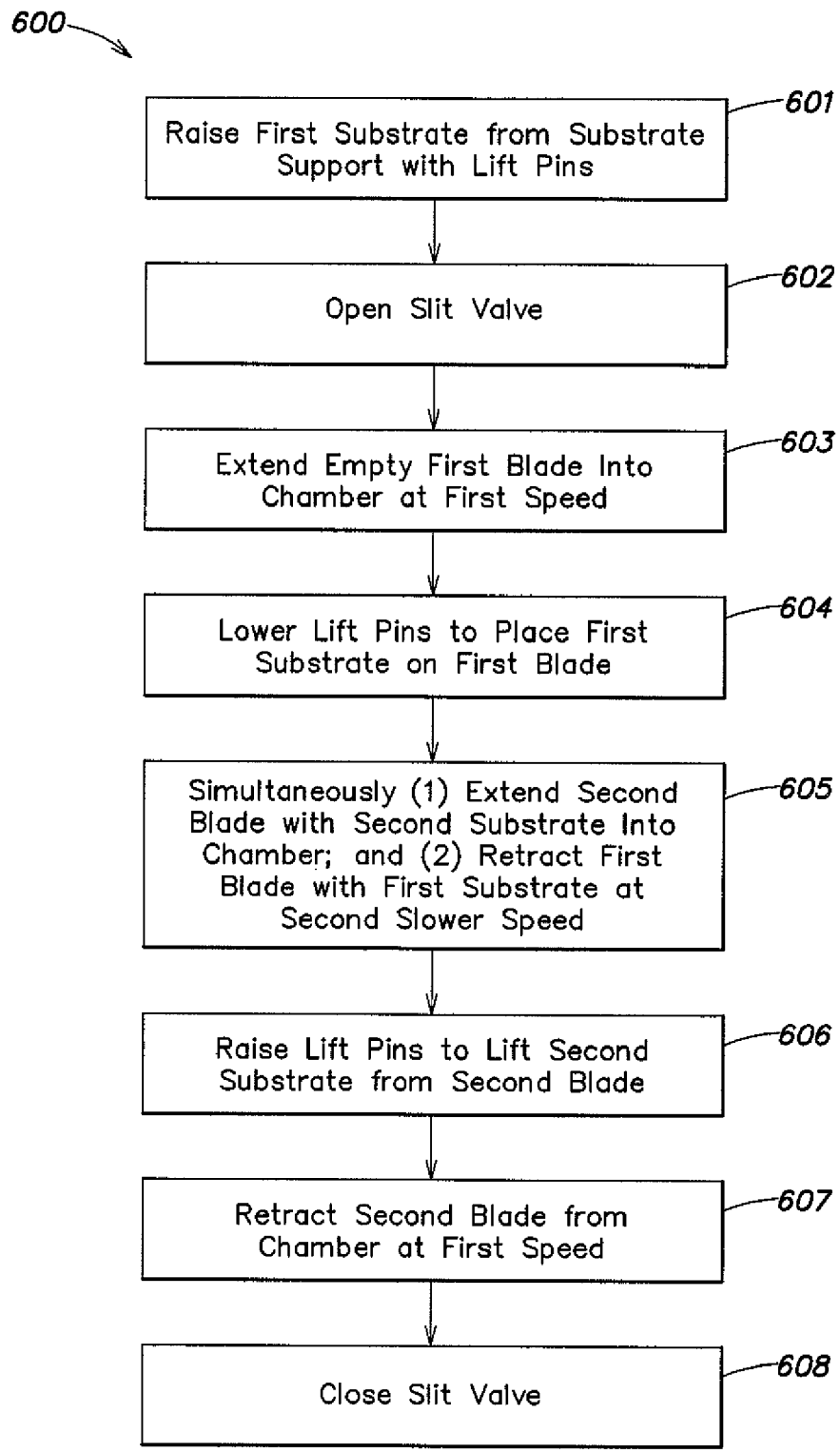
FIG. 6 is a flowchart of an exemplary process for transferring substrates into and out of a processing chamber in accordance with the present invention.

FIG. 6 is a flowchart of an exemplary process 600 for transferring substrates into and out of the processing chamber 414 in accordance with the present invention. It is assumed that the first substrate S1 has been processed within the processing chamber 414 and is to be retrieved by the first blade 402a.

With reference to FIG. 6, the process 600 begins in step 601 during which the lift pins 502a-c are raised so as to lift the first substrate S1 from the substrate support 416.

In step 602, the opening 410 is created, such as by opening a slit valve (not shown). In step 603, the empty first blade 402a is extended into the processing chamber 414 at a first speed. The first blade 402a is extended between the lift pins 502a-c and below the substrate S1.

In step 604, the lift pins 502a-c are lowered so as to place the substrate S1 on the first blade 402a. Thereafter, in step 605, two transfer operations are performed simultaneously:

(1) the second blade 402b is extended into the processing chamber 414 while supporting the second substrate S2; and (2) the first blade 402a is retracted from the processing chamber 414 while supporting the first substrate S1.

Both the first blade 402a and the second blade 402b are moved at a second speed that is slower than the first speed (e.g., a speed that ensures that the substrates S1 and S2 remain positioned on the blades 402a, 402b, respectively, if the blades 402a, 402b are pocketless). In at least one embodiment, the second speed is about half of the first speed. For example, if the empty, first blade 402a is extended into the processing chamber 414 within about one second during step 603, the first blade 402a may be retracted from the processing chamber 414 (with the first substrate S1) within about two seconds during step 605. Other speeds and/or speed differentials (or no speed differential between blades with and without substrates) may be used. For example, an empty blade may be extended and/or retracted at up to 10 or more times the speed of a blade that supports a substrate. Additionally, in other embodiments, the first and second blades 402a, 402b need not be retracted from and/or extended into the processing chamber 414 at the same time.

In step 606, the lift pins 502a-c are raised so as to lift the second substrate S2 from the second blade 402b. In step 607, the second blade 402b is retracted from the processing chamber 414 (e.g., at the first speed). Thereafter, the lift pins 502a-c may lower the substrate S2 onto the substrate support 416. In step 608, the opening 410 of the processing chamber 414 is closed and the process 600 ends.

Note that the controller 420 may be adapted (e.g., programmed) to perform or initiate one or more of the steps of the process 600.

By employing a higher rate of blade extension or retraction when a blade is not supporting a substrate, the process 600 may significantly increase the throughput of a processing system that employs the robot 400. System throughput is further increased by only retracting an empty blade the distance required to clear a transfer chamber opening or other obstruction prior to rotation, and by retracting a substrate carrying blade so as to position a center of a substrate approximately over a center of rotation of a robot prior to rotation of the substrate (as a higher rate of rotation may be employed as described previously).

The foregoing description discloses only exemplary embodiments of the invention. Modifications of the above disclosed apparatus and methods which fall within the scope of the invention will be readily apparent to those of ordinary skill in the art. For instance, robots having other numbers of blades may be configured in accordance with the present invention, such as robots having four or more blades (e.g., dual, dual blade SCARA robots).

Accordingly, while the present invention has been disclosed in connection with exemplary embodiments thereof, it should be understood that other embodiments may fall within the spirit and scope of the invention, as defined by the following claims.

The invention claimed is:

1. A method of transferring substrates during electronic device manufacturing comprising:

(a) providing an electronic device manufacturing system having:

a transfer chamber;

a processing chamber coupled to the transfer chamber; and a robot positioned within the transfer chamber and adapted to transfer substrates into and from the processing chamber, wherein the robot includes at least a first blade and a second blade each adapted to:

support a substrate;

move relative to each other; and extend into the processing chamber so as to place a substrate within or remove a substrate from the processing chamber; and (b) while the first blade is empty, extending the first blade into the processing chamber at a first speed to retrieve a first substrate from a substrate support of the processing chamber;

(c) transferring the first substrate to the first blade from the substrate support of the processing chamber;

(d) while the first blade supports the first substrate, retracting the first blade from the processing chamber at a second speed that is slower than the first speed;

(e) while the second blade supports a second substrate, extending the second blade into the processing chamber at the second speed;

(f) transferring the second substrate to the substrate support of the processing chamber; and (g) retracting the second blade from the processing chamber at the first speed only a distance required to clear obstacles during rotation.

2. The method of claim 1 wherein at least a portion of steps (d) and (e) occurs simultaneously.

3. The method of claim 1 wherein the first and second blades comprise pocketless blades.

4. The method of claim 1 wherein the robot comprises a SCARA robot.

5. The method of claim 1 wherein the robot comprises a vacuum robot.

6. The method of claim 1 wherein at least one of step (c) occurs without raising or lowering the first blade or the robot and step (f) occurs without raising or lowering the second blade or the robot.

7. The method of claim 1 wherein the first speed is at least 2 times as fast as the second speed.

8. The method of claim 1 wherein the first speed is at least 2-10 times as fast as the second speed.

9. A method of transferring a substrate between a transfer chamber and a processing chamber comprising:

providing a robot positioned within the transfer chamber and having a first blade and a second blade spaced from the first blade;

moving the first and second blade relative to each other;

employing the first and second blades to transfer substrates to and remove substrates from the processing chamber without raising or lowering the first and second blades or the robot; and moving the first and second blade at a first speed when the blade is empty only a distance required to clear obstacles during rotation and at a second speed when the blade supports a substrate, wherein the second speed is slower than the first speed.

10. The method of claim 9 further comprising simultaneously extending the first and second blades through a slit valve that separates the transfer chamber from the processing chamber.

* * * * *